US012756374B2

(12) United States Patent
Ozasa

(10) Patent No.: US 12,756,374 B2
(45) Date of Patent: Oct. 6, 2026

(54) FILTER AND FILTER MODULE

(71) Applicant: Murata Manufacturing Co., Ltd., Nagaokakyo (JP)

(72) Inventor: Motoki Ozasa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 146 days.

(21) Appl. No.: 18/626,586

(22) Filed: Apr. 4, 2024

(65) Prior Publication Data

US 2024/0250656 A1 Jul. 25, 2024

Related U.S. Application Data

(63) Continuation of application No. PCT/JP2022/037210, filed on Oct. 5, 2022.

(30) Foreign Application Priority Data

Oct. 5, 2021 (JP) ................................ 2021-164110

(51) Int. Cl.
*H03H 7/38* (2006.01)
*H01F 27/29* (2006.01)
(Continued)

(52) U.S. Cl.
CPC ............... *H03H 7/38* (2013.01); *H01F 27/29* (2013.01); *H03H 7/0138* (2013.01); *H03H 7/03* (2013.01); *H03H 9/6416* (2013.01)

(58) Field of Classification Search
CPC .......... H03H 7/38; H03H 7/0138; H03H 7/03; H03H 9/6416; H03H 7/075; H03H 7/09;
(Continued)

(56) References Cited

U.S. PATENT DOCUMENTS

2018/0234079 A1* 8/2018 Takamine ................ H03H 7/38
2022/0329226 A1 10/2022 Urata

FOREIGN PATENT DOCUMENTS

JP 2009218756 A 9/2009
JP 2010141859 A 6/2010
(Continued)

OTHER PUBLICATIONS

International Search Report in PCT/JP2022/037210, mailed Jan. 10, 2023, 3 pages.
(Continued)

*Primary Examiner* — Andrea Lindgren Baltzell
*Assistant Examiner* — Kimberly E Glenn
(74) *Attorney, Agent, or Firm* — Keating & Bennett, LLP

(57) ABSTRACT

A filter module includes an antenna connection terminal, filter elements, and inductors. The filter elements are connected to an antenna connection terminal. A first inductor is connected between the antenna connection terminal and the filter elements. A second inductor is connected between a transmission line, which connects the first inductor and the filter elements, and a ground reference potential. The filter elements are on an insulating multilayer substrate. The inductors include electrodes on the multilayer substrate. Inductor electrodes of the first inductor and central cavities of the inductor electrodes are at positions different from other electrodes inside the multilayer substrate.

18 Claims, 5 Drawing Sheets

(51) Int. Cl.
*H03H 7/01* (2006.01)
*H03H 7/03* (2006.01)
*H03H 9/64* (2006.01)

(58) Field of Classification Search
CPC .......... H03H 7/46; H03H 7/01; H03H 9/6483; H03H 9/725; H01F 27/29; H01F 17/00; H01F 27/00; H01F 27/28
See application file for complete search history.

(56) References Cited

FOREIGN PATENT DOCUMENTS

| | | | |
|---|---|---|---|
| JP | 2015109320 | A | 6/2015 |
| WO | 2021039495 | A1 | 3/2021 |

OTHER PUBLICATIONS

Written Opinion in PCT/JP2022/037210, mailed Jan. 10, 2023, 4 pages.

* cited by examiner

FILTER AND FILTER MODULE

CROSS REFERENCE TO RELATED APPLICATIONS

This application claims the benefit of priority to Japanese Patent Application No. 2021-164110 filed on Oct. 5, 2021 and is a Continuation Application of PCT Application No. PCT/JP2022/037210 filed on Oct. 5, 2022. The entire contents of each application are hereby incorporated herein by reference.

BACKGROUND OF THE INVENTION

1. Field of the Invention

The present invention relates to filters each including at least one filter element and a matching circuit including an inductor.

2. Description of the Related Art

International Publication No. 2021/039495 describes a filter module including a plurality of filters, a plurality of signal terminals, a common terminal, and a plurality of inductors.

The plurality of filters are respectively connected between the plurality of signal terminals and the common terminal. In other words, the plurality of filters on the side of the common terminal are connected (bundled) to each other and connected to the common terminal.

The plurality of inductors include a first inductor and a second inductor. The first inductor is connected between the nodes of the plurality of filters and the common terminal. The second inductor is connected between a transmission line that connects the nodes and the first inductor and a ground reference potential.

SUMMARY OF THE INVENTION

When the shape of a multilayer substrate is to be reduced while realizing a circuit configuration as described in International Publication No. 2021/039495 by, for example, the multilayer substrate, electrodes of a plurality of inductors may overlap other electrodes formed on the multilayer substrate when the multilayer substrate is viewed from one direction (for example, when viewed from the side of a top surface).

However, when the electrodes of the plurality of inductors overlap the other electrodes, the plurality of inductors cannot have desired characteristics, and there is a case where desired filter characteristics cannot be realized.

On the other hand, when the plurality of inductors have desired characteristics, the positional relationship between the electrodes of the plurality of inductors and the other electrodes is limited, so that it is not easy to form the multilayer substrate in a small size.

Therefore, example embodiments of the present invention provide filters each capable of reducing or preventing characteristic deterioration despite including a small size multilayer substrate.

A filter according to an example embodiment of the present invention includes a first input and output terminal, a second input and output terminal, and a third input and output terminal, a first filter element that is connected between the first input and output terminal and the second input and output terminal, a second filter element that is connected between the first input and output terminal and the third input and output terminal, a first inductor that is connected between the first input and output terminal and the first filter element, and a second inductor that is connected between an end portion of the first inductor and a ground reference potential, in which the first inductor and the second inductor define at least a portion of a matching circuit, the first filter element is mounted on a multilayer substrate in which a plurality of insulator layers are laminated, the first inductor and the second inductor include electrodes on the multilayer substrate, a first inductor electrode of the first inductor and a second inductor electrode of the second inductor have individual winding shapes, respectively, when the multilayer substrate is viewed in plan view, and the first inductor electrode is at a position different from other electrodes on insulator layers adjacent in a lamination direction with respect to an insulator layer on which the first inductor electrode is located in plan view.

The first inductor and the second inductor include electrodes on the multilayer substrate. A first inductor electrode of the first inductor and a second inductor electrode of the second inductor have individual winding shapes, respectively, when the multilayer substrate is viewed in plan view. In plan view, the first inductor electrode is at a position different from other electrodes on insulator layers adjacent in a lamination direction with respect to an insulator layer on which the first inductor electrode is located.

In this configuration, while reducing formation regions of the first inductor electrode and the second inductor electrode, the first inductor electrode is inhibited from coupling to the other electrodes and a magnetic field generated by the first inductor is inhibited from affecting the other electrodes. As a result, the characteristic deterioration of the first inductor, which significantly affects transmission characteristics, is reduced or prevented.

A filter module according to an example embodiment of the present invention includes a first input and output terminal, a second input and output terminal, and a third input and output terminal, a first filter element that is connected between the first input and output terminal and the second input and output terminal, a second filter element that is connected between the first input and output terminal and the third input and output terminal, a first inductor that is connected between the first input and output terminal and the first filter element, and a second inductor that is connected between an end portion of the first inductor and a ground reference potential, in which the first inductor and the second inductor define at least a portion of a matching circuit, the first filter element is mounted on a multilayer substrate in which a plurality of insulator layers are laminated, the first inductor and the second inductor include electrodes on the multilayer substrate, a first inductor electrode of the first inductor and a second inductor electrode of the second inductor have individual winding shapes, respectively, when the multilayer substrate is viewed in plan view, and the second inductor electrode includes a portion parallel or substantially parallel to sides of other electrodes, which are on the same layer as the second inductor electrode of the multilayer substrate and adjacent to the second inductor electrode, on a side of the second inductor electrode.

The first inductor and the second inductor include electrodes on the multilayer substrate. A first inductor electrode of the first inductor and a second inductor electrode of the second inductor have individual winding shapes, respectively, when the multilayer substrate is viewed in plan view.

The second inductor electrode includes a portion parallel or substantially parallel to sides of other electrodes, which are on the same layer as the second inductor electrode of the multilayer substrate and adjacent to the second inductor electrode, on a side of the second inductor electrode.

In this configuration, while reducing the formation regions of the first inductor electrode and the second inductor electrode, the formation region of the second inductor can be increased in limited ranges in the regions. As a result, the characteristics required of a circuit configured with the first inductor and the second inductor are easily realized, and characteristic deterioration at this time can be reduced or prevented.

According to example embodiments of the present invention, the characteristic deterioration of filter modules can be reduced or prevented despite including a small size multilayer substrate.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Filter modules according to example embodiments of the present invention will be described with reference to the accompanying drawings.

Circuit Configuration of Filter Module 1

Figure 1:
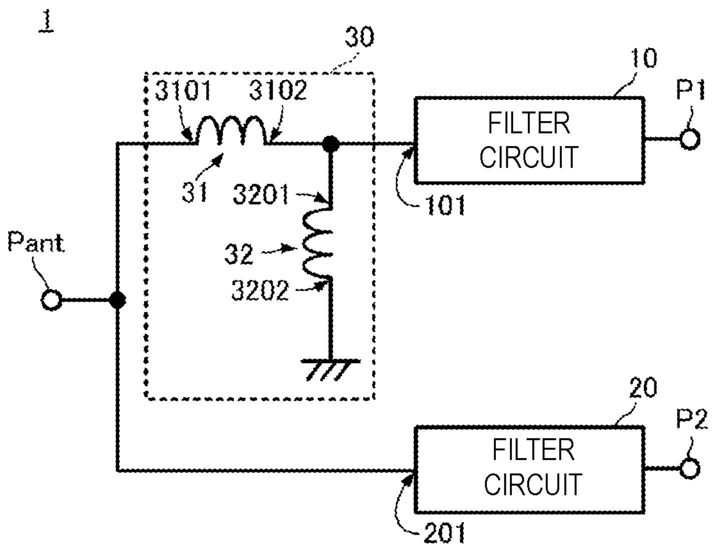
FIG. 1 is an equivalent circuit diagram of a filter module according to an example embodiment of the present invention.

FIG. 1 is an equivalent circuit diagram of a filter module according to an example embodiment of the present invention. As shown in FIG. 1, a filter module 1 includes a filter circuit 10, a filter circuit 20, and a matching circuit 30. The filter module 1 includes an antenna connection terminal Pant, an individual terminal P1, and an individual terminal P2. The number of surface acoustic wave filters included in the filter circuits 10 and 20 in the description which will be described later is an example, and the present invention is not limited thereto.

The filter circuit 10 includes a surface acoustic wave filter. For example, the filter circuit 10 includes a plurality of surface acoustic wave filters. A pass band and an attenuation band are individually set for each of the plurality of surface acoustic wave filters. At this time, the pass band and the attenuation band of each of the plurality of surface acoustic wave filters are set to correspond to a communication band assigned to each of the plurality of surface acoustic wave filters.

When the filter circuit 10 includes a plurality of surface acoustic wave filters, the individual terminal P1 is provided for each of the plurality of surface acoustic wave filters. For example, when the filter circuit 10 includes four surface acoustic wave filters, the individual terminal P1 includes four individual terminals.

The filter circuit 10 is connected between the individual terminal P1 and the antenna connection terminal Pant. The antenna connection terminal Pant may be directly connected to an antenna or may be connected to the antenna through another circuit. That is, the antenna connection terminal of the filter module 1 means a terminal (a terminal common to a plurality of filter circuits of a multiplexer) common to the filter circuit 10 and the filter circuit 20, and corresponds to a "common terminal".

The matching circuit 30 is connected between a terminal 101 of the filter circuit 10, which is on the side of the antenna connection terminal Pant, and the antenna connection terminal Pant. The matching circuit 30 includes an inductor 31 and an inductor 32.

The inductor 31 is connected between the terminal 101 of the filter circuit 10 and the antenna connection terminal Pant. More specifically, a first end 3101 of the inductor 31 is connected to the antenna connection terminal Pant. A second end 3102 of the inductor 31 is connected to the terminal 101 of the filter circuit 10. The inductor 31 corresponds to a "first inductor".

The inductor 32 is connected between a transmission line, which connects the inductor 31 and the terminal 101 of the filter circuit 10, and a ground reference potential. More specifically, a first end 3201 of the inductor 32 is connected to the transmission line (a node between the inductor 31 and the filter circuit 10) which connects the inductor 31 and the terminal 101 of the filter circuit 10. A second end 3202 of the inductor 32 is connected to the ground reference potential. The inductor 32 corresponds to a "second inductor".

The filter circuit 20 has the same circuit configuration as the filter circuit 10. The filter circuit 20 is connected between the individual terminal P2 and the antenna connection terminal Pant. More specifically, a terminal 201 of the filter circuit 20, which is on the side of the antenna connection terminal Pant, is connected to a node between the antenna connection terminal Pant and the matching circuit 30.

When the filter circuit 20 includes a plurality of surface acoustic wave filters, the individual terminal P2 is provided for each of the plurality of surface acoustic wave filters. For example, when the filter circuit 20 includes two surface acoustic wave filters, the individual terminal P2 includes two individual terminals.

With such a configuration, the filter module 1 defines a multiplexer. More specifically, the filter module 1 defines a multiplexer that includes the filter circuit 10 that is connected to the antenna connection terminal Pant through the matching circuit 30, and the filter circuit 20 that is connected to the antenna connection terminal Pant without the matching circuit 30 interposed therebetween.

Structure of Filter Module 1

The filter module 1 includes a filter element 11, a filter element 12, a filter element 21, a filter element 22, and a multilayer substrate 90.

The filter element 11, the filter element 12, the filter element 21, and the filter element 22 are the surface acoustic wave filters, and include a base mainly made of an elastic body and an interdigital transducer (IDT) electrode on the elastic body. Each of the filter element 11, the filter element 12, the filter element 21, and the filter element 22 includes a plurality of connection terminals on the bottom surface of the base.

The filter element 11 and the filter element 12 define the filter circuit 10. The filter element 21 and the filter element 22 define the filter circuit 20. The filter element 11 and the filter element 12 correspond to a "first filter element", and the filter element 21 and the filter element 22 correspond to a "second filter element".

Figure 2A:
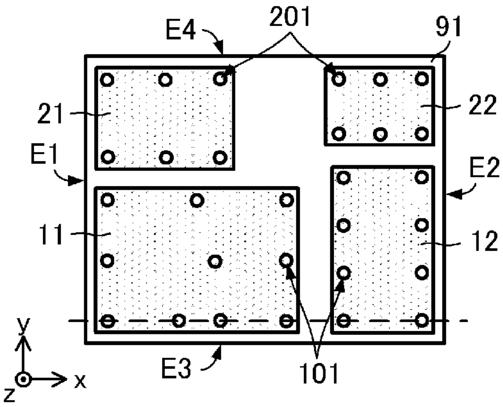
FIGS. 2A to 2F are plan views of respective layers in a multilayer substrate in the filter module.
Figure 2D:
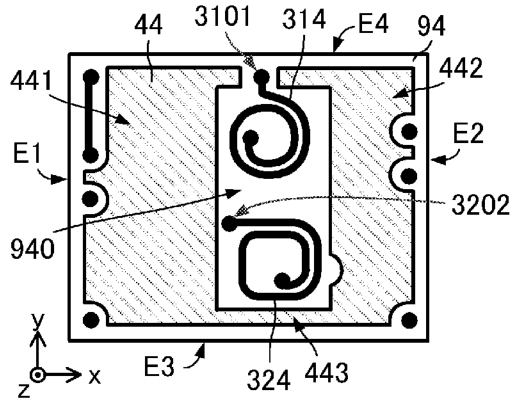
Figure 2B:
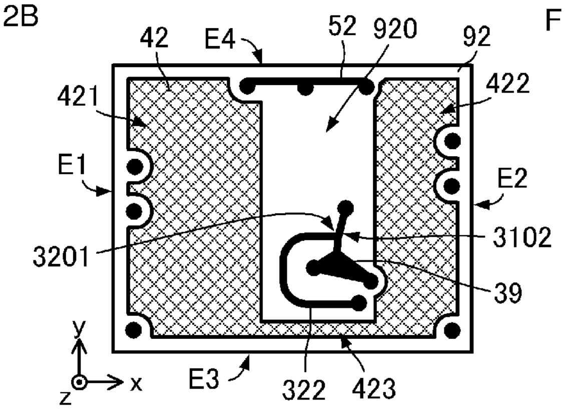
Figure 2E:
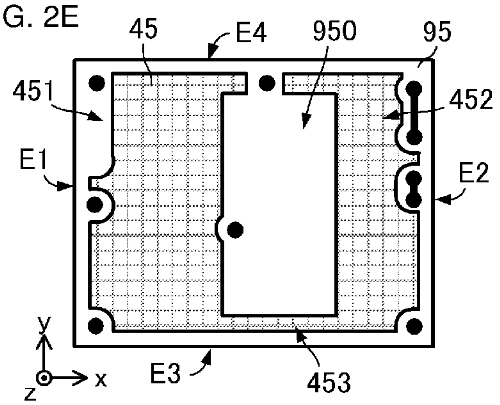
Figure 2C:
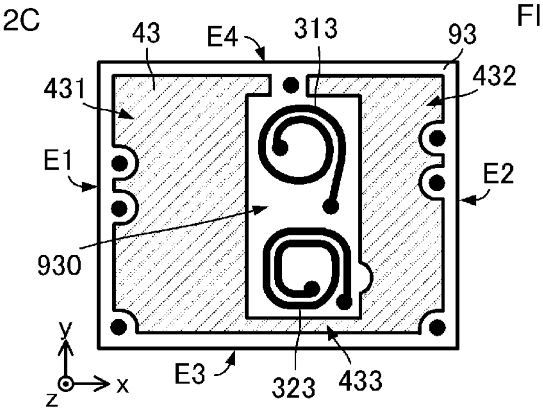
Figure 2F:
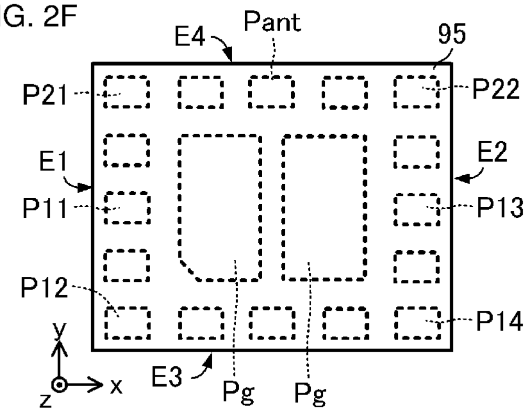
Figure 2G:
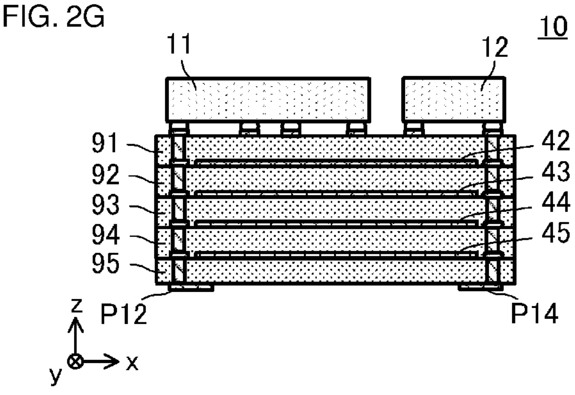
FIG. 2G is a cross-sectional view of the filter module.
Figure 3:
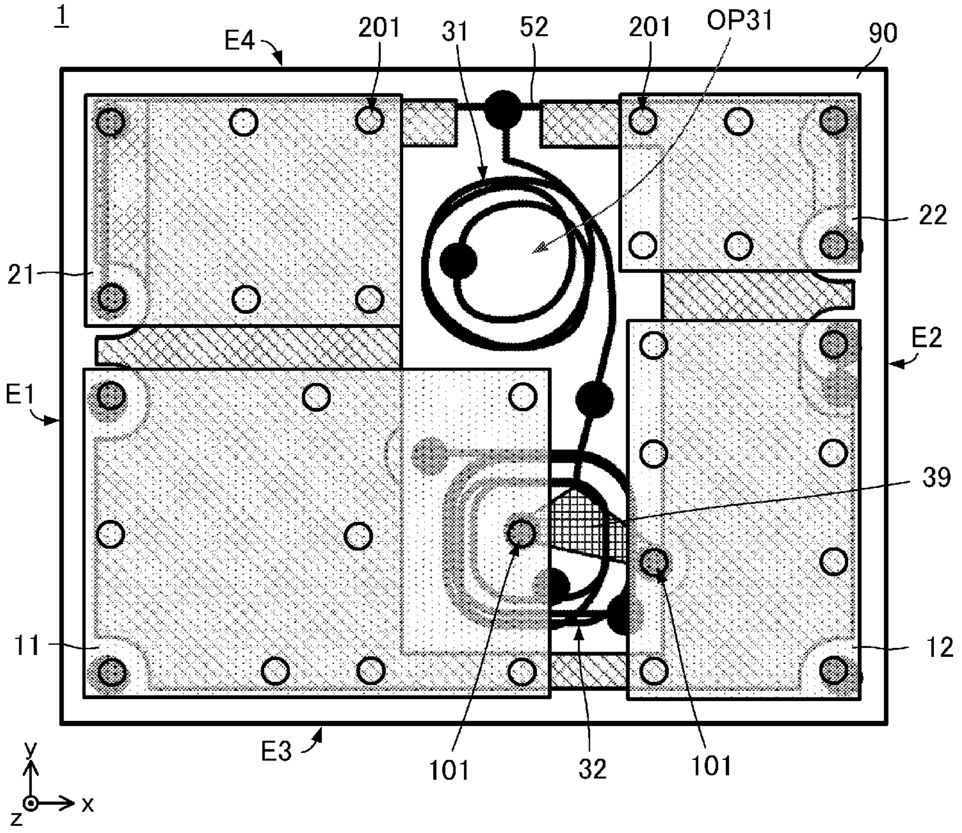
FIG. 3 is a plan view in which the respective layers of the multilayer substrate are superimposed in a state in which filter elements are mounted.

FIGS. 2A to 2F are plan views of respective layers in a multilayer substrate in the filter module, and FIG. 2G is a cross-sectional view of the filter module. FIG. 2G illustrates a cross section taken along a broken line illustrated in FIG. 2A. FIG. 2A is a diagram of a state in which the filter elements are mounted. FIG. 3 is a plan view in which the respective layers in the multilayer substrate are superimposed in a state in which the filter elements are mounted. In FIG. 3, an external connection electrode on the bottom surface of the multilayer substrate is not illustrated. In addition, in FIGS. 2A to 2F, and FIG. 3, a black circle indicates an interlayer connection conductor extending in a lamination direction (a depth direction from a paper surface of this specification), and a white circle indicates a pad electrode to mount the filter element. Regarding to the interlayer connection conductor, although FIGS. 2A to 2F, and FIG. 3 illustrate a connection relationship with other electrodes, a specific description is omitted.

As illustrated in FIGS. 2A to 2F, and 2G, and FIG. 3, the multilayer substrate 90 has a rectangular parallelepiped shape in plan view. In plan view of the multilayer substrate 90, the multilayer substrate 90 is viewed from a lamination direction of a plurality of insulator layers 91 to 95 of the multilayer substrate 90. The lamination direction is a direction parallel or substantially parallel to a z axis in FIGS. 2A to 2F, and FIG. 3.

The multilayer substrate 90 includes a top surface, a bottom surface, and four side end surfaces E1, E2, E3, and E4. The side end surfaces E1 and E2 have a shape that extends in a second direction (y axis direction) of the multilayer substrate 90, and are end surfaces at both ends in a first direction (x axis direction). The side end surfaces E3 and E4 have a shape that extends in the first direction (x axis direction) of the multilayer substrate 90, and are end surfaces at both ends in the second direction (y axis direction).

As illustrated in FIGS. 2A to 2F, the multilayer substrate 90 includes the plurality of insulator layers 91 to 95. The plurality of insulator layers 91 to 95 are laminated in order of the insulator layer 91, the insulator layer 92, the insulator layer 93, the insulator layer 94, and the insulator layer 95 from a top surface side to a bottom surface side of the multilayer substrate 90.

A plurality of electrode patterns, the interlayer connection conductors, and the like are on the plurality of insulator layers 91 to 95 (the details of the plurality of electrode patterns will be described later). A circuit pattern of the filter module 1 includes the plurality of electrode patterns and the interlayer connection conductors. In other words, the filter module 1 includes the multilayer substrate 90 that is a multilayer body of the plurality of insulator layers 91 to 95, the plurality of electrode patterns on the top surface, the bottom surface, the side surfaces, and the inside of the multilayer substrate 90, and the plurality of interlayer connection conductors in the multilayer substrate 90.

As illustrated in FIG. 2A, the insulator layer 91 includes a plurality of pad electrodes to mount the filter element 11, the filter element 12, the filter element 21, and the filter element 22. The filter element 11, the filter element 12, the filter element 21, and the filter element 22 are mounted on a surface of the insulator layer 91 (a surface opposite to the insulator layer 92) by the plurality of pad electrodes.

As a specific example, the filter element 11 is mounted at a corner portion between the side end surface E1 and the side end surface E3 in the insulator layer 91. The filter element 12 is at a corner portion between the side end surface E2 and the side end surface E3 in the insulator layer 91. The filter element 21 is mounted at a corner portion between the side end surface E1 and the side end surface E4 in the insulator layer 91. The filter element 22 is at a corner portion between the side end surface E2 and the side end surface E4 in the insulator layer 91.

That is, the filter element 11 and the filter element 12 are positioned along the side end surface E3. The filter element 21 and the filter element 22 are positioned along the side end surface E4. The filter element 11 and the filter element 21 are positioned along the side end surface E1. The filter element 12 and the filter element 22 are positioned along the side end surface E2.

At this time, in plan view, the filter element 21 and the filter element 22 sandwich a formation region of the inductor 31 and not to overlap the formation region of the inductor 31. In other words, in plan view, the pad electrodes on which the filter element 21 is mounted and the pad electrodes on which the filter element 22 is mounted sandwich the formation region of the inductor 31 and not to overlap the formation region of the inductor 31 (refer to FIG. 3).

As illustrated in FIG. 2B, the insulator layer 92 includes an inductor electrode 322, wiring electrodes 39 and 52, and a ground electrode 42. The ground electrode 42 includes a partial electrode 421 along the side end surface E1, a partial electrode 422 along the side end surface E2, and a partial electrode 423 along the side end surface E3. The partial electrode 421 partially overlaps mounting regions of the filter element 11 and the filter element 21 in plan view. The partial electrode 422 partially overlaps mounting regions of the filter element 12 and the filter element 22 in plan view. The partial electrode 423 connects the partial electrode 421 and the partial electrode 422. As a result, a region 920 surrounded by the ground electrode 42 is provided on a surface of the insulator layer 92 on a side of the insulator layer 91.

The inductor electrode 322 and the wiring electrode 39 are in the region 920. The inductor electrode 322 is an annular shaped (winding shaped) linear conductor having less than one turn. The inductor electrode 322 has an annular shape having a straight line-shaped portion parallel or substantially parallel to the side surface of the partial electrode 421 on a side of the region 920 and a straight line-shaped portion parallel or substantially parallel to the side surface of the partial electrode 423 on a side of the region 920.

One end of the inductor electrode 322 is connected to the wiring electrode 39. A node between the inductor electrode 322 and the wiring electrode 39 is the first end 3201 of the inductor 32.

A portion of the wiring electrode 39 is in a region surrounded by the inductor electrode 322. Accordingly, in plan view, a plane area of the multilayer substrate 90 is small compared to an aspect in which the wiring electrode 39 is at a spot (different spot) that does not overlap the inductor electrode 322.

As illustrated in FIG. 2C, the insulator layer 93 includes an inductor electrode 313, an inductor electrode 323, and a ground electrode 43. The ground electrode 43 includes a partial electrode 431 along the side end surface E1, a partial electrode 432 along the side end surface E2, and a partial electrode 433 along the side end surface E3. The partial electrode 431 partially overlaps the partial electrode 421 of the insulator layer 92 in plan view. The partial electrode 432 partially overlaps the partial electrode 422 of the insulator layer 92 in plan view. The partial electrode 433 partially overlaps the partial electrode 423 of the insulator layer 92 in plan view, and connects the partial electrode 431 and the partial electrode 432. As a result, a region 930 surrounded by the ground electrode 43 is provide on a surface of the insulator layer 93 on a side of the insulator layer 92. In plan view, the region 930 substantially overlaps the region 920 as a whole.

The inductor electrode 313 and the inductor electrode 323 are in the region 930. The inductor electrode 313 is an annular-shaped linear conductor having more than one turn.

In a case of an inductor electrode including an annular-shaped linear conductor having more than one turn in a state in which the multilayer substrate 90 is viewed in plan view, regardless of the number of layers of the insulator layer in which the linear conductor of the inductor electrode is formed, a cavity is an inner side portion surrounded by the linear conductor. In addition, in a case of an inductor electrode including an annular-shaped linear conductor having less than one turn in a state in which the multilayer substrate 90 is viewed in plan view, regardless of the number of layers of the insulator layer in which the linear conductor of the inductor electrode is located, the cavity is an inner side portion surrounded by a straight line that connects both ends in the extending direction of the inductor electrode and the annular-shaped inductor electrode having less than one turn.

An outer peripheral end of the inductor electrode 313 is connected to the wiring electrode 39 through the interlayer connection conductors. The outer peripheral end of the inductor electrode 313 is the second end 3102 of the inductor 31.

The inductor electrode 323 is an annular-shaped linear conductor having more than one turn. The inductor electrode 323 has an annular shape having a straight line-shaped portion parallel or substantially parallel to the side surface of the partial electrode 431 on a side of the region 930, a straight line-shaped portion parallel or substantially parallel to a surface of the partial electrode 432 on the side of the region 930, and a straight line-shaped portion parallel or substantially parallel to the side surface of the partial electrode 433 on the side of the region 930. In plan view, a cavity of the inductor electrode 323 overlaps a cavity of the inductor electrode 322.

The outer peripheral end of the inductor electrode 323 is connected to the end portion of the inductor electrode 322 on a side opposite to the end portion that is connected to the wiring electrode 39 through the interlayer connection conductors.

As illustrated in FIG. 2D, the insulator layer 94 includes an inductor electrode 314, an inductor electrode 324, and a ground electrode 44. The ground electrode 44 includes a partial electrode 441 along the side end surface E1, a partial electrode 442 along the side end surface E2, and a partial electrode 443 along the side end surface E3. The partial electrode 441 partially overlaps the partial electrode 431 of the insulator layer 93 in plan view. The partial electrode 442 partially overlaps the partial electrode 432 of the insulator layer 93 in plan view. The partial electrode 443 partially overlaps the partial electrode 433 of the insulator layer 93 in plan view, and connects the partial electrode 441 and the partial electrode 442. As a result, a region 940 surrounded by the ground electrode 44 is provided on a surface of the insulator layer 94 on a side of the insulator layer 93. In plan view, the region 940 substantially overlaps the region 930 as a whole.

The inductor electrode 314 and the inductor electrode 324 are in the region 940. The inductor electrode 314 is an annular-shaped linear conductor having more than one turn. The inductor electrode 314 has an annular shape having no straight line-shaped portion. In plan view, a cavity of the inductor electrode 314 overlaps a cavity of the inductor electrode 313.

An inner peripheral end of the inductor electrode 314 is connected to an inner peripheral end of the inductor electrode 313. An outer peripheral end of the inductor electrode 314 is the first end 3101 of the inductor 31.

The inductor electrode 324 is an annular-shaped linear conductor having more than one turn. The inductor electrode 324 has an annular shape having a straight line-shaped portion parallel or substantially parallel to the side surface of the partial electrode 441 on a side of the region 940, a straight line-shaped portion parallel or substantially parallel to a surface of the partial electrode 442 on the side of the region 940, and a straight line-shaped portion parallel or substantially parallel to the side surface of the partial electrode 443 on the side of the region 940. In plan view, a cavity of the inductor electrode 324 overlaps the cavity of the inductor electrode 323.

An inner peripheral end of the inductor electrode 324 is connected to an inner peripheral end of the inductor electrode 323 through the interlayer connection conductors. An outer peripheral end of the inductor electrode 324 is connected to a ground terminal Pg on the bottom surface of the multilayer substrate 90 through the interlayer connection conductors.

As illustrated in FIG. 2E, a ground electrode 45 is on the surface of the insulator layer 95. The ground electrode 45 includes a partial electrode 451 along the side end surface E1, a partial electrode 452 along the side end surface E2, and a partial electrode 453 along the side end surface E3. The partial electrode 451 partially overlaps the partial electrode 441 of the insulator layer 94 in plan view. The partial electrode 452 partially overlaps the partial electrode 442 of the insulator layer 94 in plan view. The partial electrode 453 partially overlaps the partial electrode 443 of the insulator layer 94 in plan view, and connects the partial electrode 451 and the partial electrode 452. As a result, a region 950 surrounded by the ground electrode 45 is on a surface of the insulator layer 95 on a side of the insulator layer 94. In plan view, the region 950 substantially overlaps the region 940 as a whole.

As illustrated in FIG. 2F, the antenna connection terminal Pant, a plurality of individual terminal electrodes P11, P12, P13, P14, P21, P22, and a plurality of ground terminals Pg are provided on the back surface (the bottom surface of the multilayer substrate 90) of the insulator layer 95.

The antenna connection terminal Pant is connected to the outer peripheral end of the inductor electrode 314 through the interlayer connection conductors. In addition, the antenna connection terminal Pant is connected to the filter element 21 and the filter element 22 through the interlayer connection conductor, the wiring electrode 52, and the like.

The plurality of individual terminal electrodes P11 and P12 are connected to the filter element 11 through the interlayer connection conductors or the like. The plurality of individual terminal electrodes P13 and P14 are connected to the filter element 12 through the interlayer connection conductors or the like. The individual terminal electrode P21 is connected to the filter element 21 through the interlayer connection conductor or the like. The individual terminal electrode P22 is connected to the filter element 22 through the interlayer connection conductor or the like.

The plurality of ground terminals Pg are connected to the ground electrode 45 and the outer peripheral end of the inductor electrode 324 through respective individual interlayer connection conductors and the like. The ground electrode 45 is connected to the ground electrode 44 through a plurality of interlayer connection conductors, the ground electrode 44 is connected to the ground electrode 43 through a plurality of interlayer connection conductors, and the ground electrode 43 is connected to the ground electrode 42 through a plurality of interlayer connection conductors. The ground electrode 42 is connected to the ground terminals of the filter element 11, the filter element 12, the filter element 21, and the filter element 22.

With such a configuration, the inductor 31 includes the plurality of inductor electrodes 313 and 314 and the interlayer connection conductors, and the inductor 32 includes the plurality of inductor electrodes 322, 323, and 324 and the interlayer connection conductors. The plurality of inductor electrodes 313 and 314 correspond to a "first inductor electrode", and the plurality of inductor electrodes 322, 323, and 324 correspond to a "second inductor electrode". With such a configuration, the filter module 1 includes the plurality of filter elements 11, 12, 21, and 22 and the multilayer substrate 90.

In such a configuration, the filter module 1 realizes the following operation effects.

As shown in FIG. 3, in plan view of the multilayer substrate 90, the plurality of inductor electrodes 313 and 314 of the inductor 31 do not overlap other electrodes inside the multilayer substrate 90. That is, in plan view, the formation region of the inductor 31 does not overlap the other electrodes inside the multilayer substrate 90. In other words, in plan view, the formation region of the inductor 31 is at a position different from the positions of the other electrodes inside the multilayer substrate 90. The formation region of the inductor 31 is a region that includes the inductor electrodes 313 and 314 and a cavity OP31 surrounded by the inductor 31 (the inductor electrodes 313 and 314).

Accordingly, the generation of eddy current loss due to the other electrodes blocking a magnetic field generated by the inductor 31 can be reduced or prevented. Further, the parasitic capacitance of the inductor 31 due to other electrodes can be reduced or prevented, and the deterioration of Q due to reduction in the frequency of the self-resonant frequency and the increase in the dielectric loss tan δ can be reduced or prevented.

The plurality of inductor electrodes 313 and 314 of the inductor 31 do not overlap at least other electrodes on the insulator layer adjacent in a lamination direction with respect to the insulator layers on which the inductor electrodes 313 and 314 are located.

Accordingly, it is possible to prevent overlapping with electrodes that significantly affect the characteristics of each inductor 31. Therefore, it is possible to effectively reduce or prevent the generation of eddy current loss due to other electrodes blocking the magnetic field generated by the inductor 31. Further, it is possible to effectively reduce or prevent the parasitic capacitance of the inductor 31 due to other electrodes, and it is possible to effectively reduce or prevent the deterioration of Q due to the reduction in the frequency of the self-resonant frequency and the increase in the dielectric loss tan δ.

Further, the plurality of inductor electrodes 313 and 314 of the inductor 31 do not overlap at least electrodes connected to the ground reference potential, such as the ground electrode, as the other electrodes.

Accordingly, it is possible to prevent overlapping with electrodes that significantly affect the characteristics of each inductor 31. Therefore, it is possible to effectively reduce or prevent the generation of eddy current loss due to other electrodes blocking the magnetic field generated by the inductor 31. Further, it is possible to effectively reduce or prevent the parasitic capacitance of the inductor 31 due to other electrodes, and it is possible to effectively reduce or prevent the deterioration of Q due to the reduction in the frequency of the self-resonant frequency and the increase in the dielectric loss tan δ.

Further, in the configuration of the filter module 1, in plan view of the filter module 1, the formation region of the inductor 31 does not overlap the pad electrodes to mount the plurality of filter elements 11, 12, 21, and 22 and the plurality of filter elements 11, 12, 21, and 22. Accordingly, the above-described operation effects can be more effectively realized.

Here, the inductor 31 is an inductor connected in series to the transmission line. Therefore, the characteristic deterioration of the inductor 31 significantly affects the characteristic deterioration of the matching circuit 30. Therefore, various characteristic deteriorations of the inductor 31 can be reduced or prevented as described above, so that the characteristics of the matching circuit 30 can be improved by reducing or preventing the characteristic deterioration of the matching circuit 30. As a result, it is possible to realize reduction or prevention of the characteristic deterioration and improvement of the characteristics as the filter module 1.

Further, in this configuration, as illustrated in FIG. 3, in plan view of the filter module 1, the plurality of inductor electrodes 322, 323, and 324 of the inductor 32 overlap other electrodes (for example, the wiring electrode 39) inside the multilayer substrate 90, the pad electrode to mount the filter element 11, and the filter element 11. That is, in plan view, the formation region of the inductor 32 overlaps the other electrodes (for example, the wiring electrode 39) inside the multilayer substrate 90, the pad electrodes to mount the filter element 11, and the filter element 11.

Accordingly, the formation region of the inductor 32 in the limited plane area of the multilayer substrate 90 can be increased. Therefore, it is possible to increase the inductance of the inductor 32. As a result, the matching circuit 30 is capable of more reliably realizing impedance matching of the filter circuit 10 on the side of the antenna connection terminal Pant.

Here, the inductor 32 is not an inductor connected in series to the transmission line but an inductor connected between the transmission line and the ground potential. Therefore, the influence of the characteristic deterioration of the inductor 32 on the characteristic deterioration of the matching circuit 30 is small. Therefore, even when the characteristics of the inductor 32 deteriorate to some extent as described above, the influence on the characteristic deterioration of the matching circuit 30 is small. Accordingly, the improvement in the characteristics of the matching circuit 30 due to the improvement in the characteristics of the inductor 31 described above is hardly hindered. As a result, it is possible to realize improvement of the characteristics as the filter module 1 by realizing more reliable impedance matching.

As described above, the filter module 1 can reduce or prevent characteristic deterioration despite including a small size multilayer substrate 90.

Figure 4A:
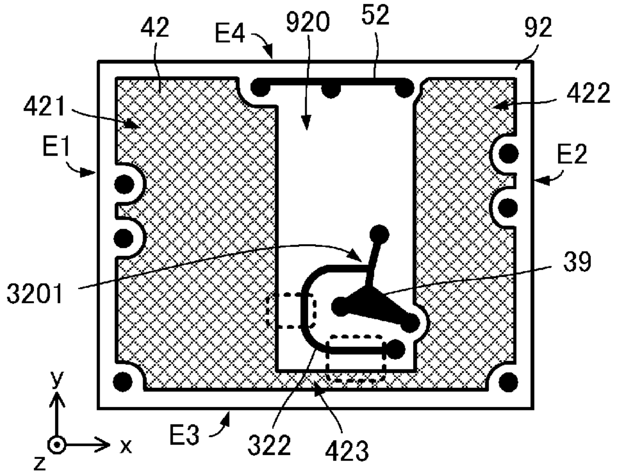
FIGS. 4A to 4C are enlarged plan views of a plurality of insulator layers of the multilayer substrate.
Figure 4B:
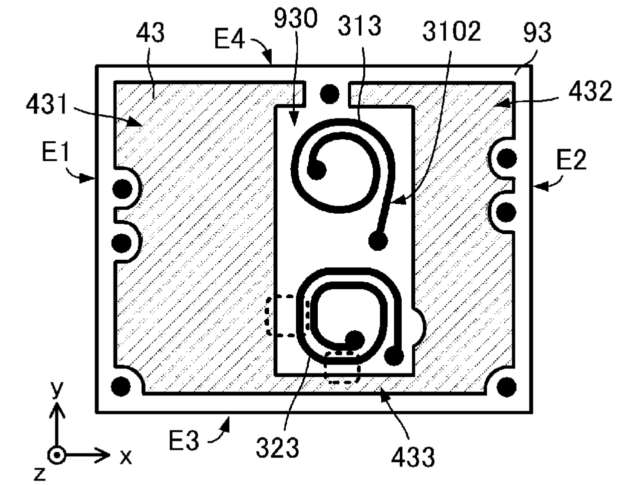
Figure 4C:
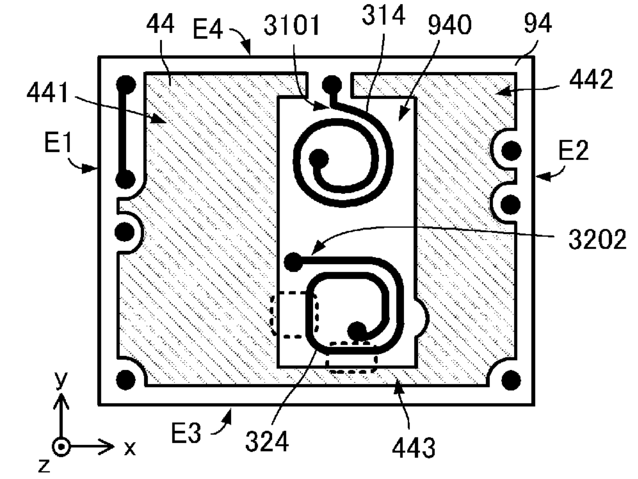

Further, the inductor 31 and the inductor 32 have the following features. FIGS. 4A to 4C are enlarged plan views of a plurality of insulator layers of the multilayer substrate. Specifically, FIG. 4A illustrates the insulator layer 92, FIG. 4B illustrates the insulator layer 93, and FIG. 4C illustrates the insulator layer 94.

As illustrated in FIG. 4A, the inductor electrode 322 include a plurality of straight line-shaped portions (dotted frame portions) parallel or substantially parallel to the sides of the plurality of partial electrodes 421 and 423 on the side of the region 920. As illustrated in FIG. 4B, the inductor electrode 323 includes a plurality of straight line-shaped portions (dotted frame portions) parallel or substantially parallel to the sides of the plurality of partial electrodes 431 and 433 on the side of the region 930. As illustrated in FIG. 4C, the inductor electrode 324 includes a plurality of straight line-shaped portions (dotted frame portions) parallel or substantially parallel to the sides of the plurality of partial electrodes 441 and 443 on the side of the region 940. The word "parallel" here is not limited to complete parallel, but includes a "substantially parallel" state in which there is unevenness that occurs when the electrode pattern is formed.

By including the straight line-shaped portions, the inductor 32 including the plurality of inductor electrodes 322, 323, and 324 can make the electrodes longer than a shape that does not include the straight line-shaped portions. Accordingly, the inductor 32 can increase the inductance in a limited area. At this time, capacitive coupling with each of the ground electrodes 42, 43, and 44 occurs, but for the above-described reason, the influence of the inductor 32 on the characteristics of the matching circuit 30 is small even when the capacitive coupling occurs. As a result, as the matching circuit 30, it is possible to more reliably realize the desired characteristics.

Further, as illustrated in FIGS. 4B and 4C, the inductor electrodes 313 and 314 do not have the straight line-shaped portions. In other words, the inductor electrodes 313 and 314 are configured with a curved shape in plan view. At least portions of the inductor electrodes 313 and 314, which are adjacent to the other electrodes on the same layer as the respective inductor electrodes 313 and 314, may be curved lines in plan view, but it is preferable that the whole inductor electrodes 313 and 314 include curved lines.

Accordingly, the inductor electrode 313 does not have a spot parallel or substantially parallel to the sides of the plurality of partial electrodes 431, 432, and 433 on the side of the region 930. The inductor electrode 314 does not have a spot parallel or substantially parallel to the sides of the plurality of partial electrodes 441, 442, and 443 on the side of the region 940. Therefore, the capacitive coupling between the inductor electrode 313 and the ground electrode 43 can be reduced or prevented, and the capacitive coupling between the inductor electrode 314 and the ground electrode 44 can be reduced or prevented. Therefore, the capacitive coupling between the inductor 31 and the plurality of ground electrodes 43 and 44 can be reduced or prevented.

As a result, the characteristic deterioration of the matching circuit 30 can be reduced or prevented. Furthermore, as described above, the characteristic deterioration of the inductor 31 significantly affects the characteristic deterioration of the matching circuit 30. Therefore, the characteristic deterioration of the matching circuit 30 is further effectively reduced or prevented by reducing or preventing the characteristic deterioration of the inductor 31.

In the above description, the relationship between the winding direction of the inductor 31 and the winding direction of the inductor 32 is not specifically described. However, it is preferable that the winding direction of the inductor 31 and the winding direction of the inductor 32 prevent the magnetic field generated by the inductor 31 and the magnetic field generated by the inductor 32 from coupling to each other (reduce or prevent coupling).

Figure 5A:
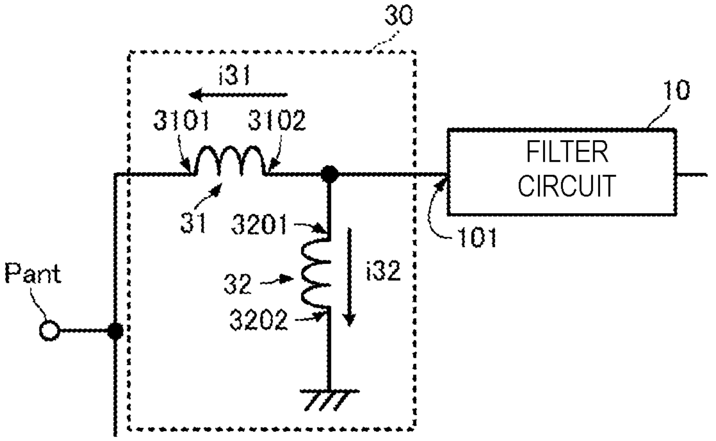
FIG. 5A is an equal circuit diagram illustrating a current flow when a filter circuit 10 in the filter module is a transmission filter.
Figure 5B:
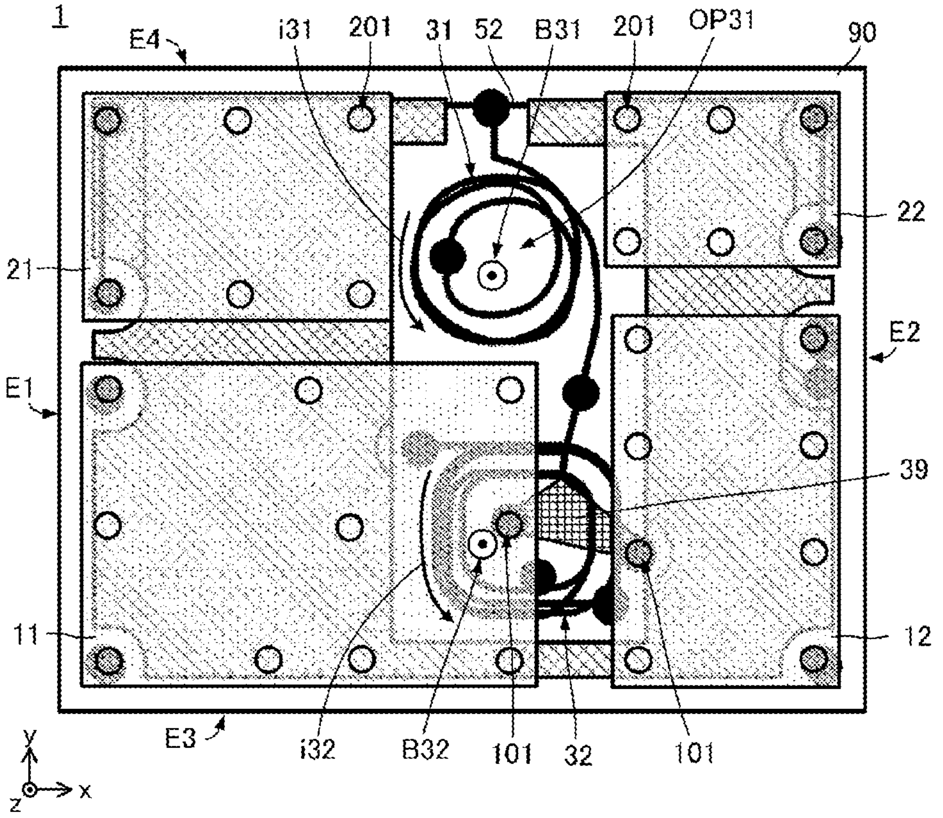
FIG. 5B is a plan view illustrating a current flow and a direction of the magnetic flux when the filter circuit 10 in the filter module is a transmission filter.

FIG. 5A is an equivalent circuit diagram illustrating a current flow when the filter circuit 10 in the filter module is a transmission filter, and FIG. 5B is a plan view illustrating a current flow and a direction of the magnetic flux when the filter circuit 10 in the filter module is a transmission filter.

Here, it is assumed that the direction in which the signal is transmitted and the direction in which the current flows are the same direction. As shown in FIG. 5A, when the transmission signal is transmitted from the filter circuit 10 toward the antenna connection terminal Pant through the matching circuit 30, the direction of a current i31 flowing through the inductor 31 is a direction from the filter circuit 10 toward the antenna connection terminal Pant. At this time, the direction of a current i32 flowing through the inductor 32 is a direction from the transmission line, which connects the filter circuit 10 and the inductor 31, toward the ground reference potential.

In this case, as illustrated in FIG. 5B, both the current i31 and the current i32 flow counterclockwise when the multilayer substrate 90 is viewed from a side on which the filter element is mounted. As a result, a direction of a magnetic flux B31 generated in the inductor 31 by the current i31 and the direction of a magnetic flux B32 generated in the inductor 32 by the current i32 are the same. Therefore, the coupling of the magnetic field generated by the inductor 31 and the magnetic field generated by the inductor 32 is reduced or prevented.

Accordingly, the inductance of the inductor 31 and the inductance of the inductor 32 are easily set to desired values individually and more reliably. Therefore, the matching circuit 30 can be set to the desired value more reliably.

The relationship between an electrode width of the inductor 31 and an electrode width of the inductor 32 is not specifically illustrated. However, it is preferable that the electrode widths have the following relationship.

The electrode width of the inductor 31 (the electrode widths of the inductor electrodes 313 and 314 in the above-described case) is larger than the electrode width of the inductor 32 (the electrode widths of the inductor electrodes 322, 323, and 324 in the above-described case). Accordingly, the resistance components of the inductor 31 can be reduced and Q can be improved. On the other hand, the inductor 32 can be longer in a fixed area. Accordingly, the inductor 32 is capable of realizing larger inductance.

In the above-described configuration, an aspect in which the inductor 32 is connected to a side of the filter circuit 10 of the inductor 31 is illustrated. However, the inductor 32 may be connected to the side of the antenna connection terminal Pant of the inductor 31.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter module comprising:

a first input and output terminal, a second input and output terminal, and a third input and output terminal;

a first filter element that is connected between the first input and output terminal and the second input and output terminal;

a second filter element that is connected between the first input and output terminal and the third input and output terminal;

a first inductor that is connected between the first input and output terminal and the first filter element; and a second inductor that is connected between an end portion of the first inductor and a ground reference potential; wherein the first inductor and the second inductor define at least a portion of a matching circuit;

the first filter element is mounted on a multilayer substrate in which a plurality of insulator layers are laminated;

the first inductor and the second inductor include electrodes on the multilayer substrate;

a first inductor electrode of the first inductor and a second inductor electrode of the second inductor have individual winding shapes, respectively, when the multilayer substrate is viewed in plan view;

the first inductor electrode is at a position different from other electrodes on insulator layers adjacent in a lamination direction with respect to an insulator layer on which the first inductor electrode is located in plan view; and the other electrodes are connected to the ground reference potential.

2. The filter module according to claim 1, wherein the first inductor electrode is at a position different from other electrodes on insulator layers other than the insulator layers adjacent in the lamination direction.

3. The filter module according to claim 1, wherein a cavity surrounded by the first inductor electrode is at a position different from the other electrodes in plan view.

4. The filter module according to claim 1, wherein the second inductor electrode and at least a portion of a cavity surrounded by the second inductor electrode are at positions that overlap the other electrodes in plan view.

5. The filter module according to of claim 1, wherein the first inductor electrode and the second inductor electrode are shaped to reduce coupling between a magnetic field generated by the first inductor and a magnetic field generated by the second inductor.

6. The filter module according to claim 1, wherein an electrode width of the first inductor electrode is larger than an electrode width of the second inductor electrode.

7. The filter module according to claim 1, wherein the second filter element is mounted on the multilayer substrate.

8. The filter module according to claim 1, wherein each of the first filter element and the second filter element includes a piezoelectric body and an IDT electrode on the piezoelectric body.

9. The filter module according to claim 1, wherein the filter module is a multiplexer.

10. The filter module according to claim 9, wherein a filter circuit is connected to an antenna connection terminal through the matching circuit, and a filter circuit is connected to the antenna connection terminal without the matching circuit interposed therebetween.

11. A filter module comprising:

a first input and output terminal, a second input and output terminal, and a third input and output terminal;

a first filter element that is connected between the first input and output terminal and the second input and output terminal;

a second filter element that is connected between the first input and output terminal and the third input and output terminal;

a first inductor that is connected between the first input and output terminal and the first filter element; and a second inductor that is connected between an end portion of the first inductor and a ground reference potential; wherein the first inductor and the second inductor define at least a portion of a matching circuit;

the first filter element is mounted on a multilayer substrate in which a plurality of insulator layers are laminated;

the first inductor and the second inductor include electrodes on the multilayer substrate;

a first inductor electrode of the first inductor and a second inductor electrode of the second inductor have individual winding shapes, respectively, when the multilayer substrate is viewed in plan view;

the second inductor electrode includes a portion parallel or substantially parallel to sides of other electrodes, which are on the same layer as the second inductor electrode of the multilayer substrate and adjacent to the second inductor electrode, on a side of the second inductor electrode; and the second inductor electrode and at least a portion of a cavity surrounded by the second inductor electrode are at positions that overlap the other electrodes in plan view.

12. The filter module according to claim 11, wherein a portion of the first inductor electrode adjacent to other electrodes on a same layer as the first inductor electrode has a curved shape in plan view.

13. The filter module according to of claim 11, wherein the first inductor electrode and the second inductor electrode are shaped to reduce coupling between a magnetic field generated by the first inductor and a magnetic field generated by the second inductor.

14. The filter module according to claim 11, wherein an electrode width of the first inductor electrode is larger than an electrode width of the second inductor electrode.

15. The filter module according to claim 11, wherein the second filter element is mounted on the multilayer substrate.

16. The filter module according to claim 11, wherein each of the first filter element and the second filter element includes a piezoelectric body and an IDT electrode on the piezoelectric body.

17. The filter module according to claim 11, wherein the filter module is a multiplexer.

18. The filter module according to claim 17, wherein a filter circuit is connected to an antenna connection terminal through the matching circuit, and a filter circuit is connected to the antenna connection terminal without the matching circuit interposed therebetween.

* * * * *